(12) United States Patent
Tateishi et al.

(10) Patent No.: US 8,742,314 B2
(45) Date of Patent: Jun. 3, 2014

(54) LIGHT AMOUNT DETECTING APPARATUS, AND LIGHT AMOUNT INFORMATION PROCESSING APPARATUS

(75) Inventors: Kiyoshi Tateishi, Hannou (JP); Yoshihiro Hanada, Yokohama (JP); Michiaki Nakamura, Yamanashi (JP)

(73) Assignees: Pioneer Corporation, Kanagawa (JP); Pioneer Micro Technology Corporation, Yamanashi (JP)

( * ) Notice: Subject to any disclaimer, the term of this patent is extended or adjusted under 35 U.S.C. 154(b) by 395 days.

(21) Appl. No.: 13/380,407

(22) PCT Filed: Jul. 1, 2009

(86) PCT No.: PCT/JP2009/062051
§ 371 (c)(1),
(2), (4) Date: Dec. 22, 2011

(87) PCT Pub. No.: WO2011/001523
PCT Pub. Date: Jan. 6, 2011

(65) Prior Publication Data
US 2012/0105033 A1    May 3, 2012

(51) Int. Cl.
*H03F 3/08* (2006.01)
(52) U.S. Cl.
USPC ........................................... 250/214 A
(58) Field of Classification Search
USPC ............................................ 250/214 A
See application file for complete search history.

(56) References Cited

U.S. PATENT DOCUMENTS

| 5,900,960 | A | 5/1999 | Reime |
| 6,326,620 | B1 | 12/2001 | Willis |
| 7,279,982 | B1 * | 10/2007 | Zhou et al. ............... 330/301 |

FOREIGN PATENT DOCUMENTS

| JP | 52-142513 | 11/1977 |
| JP | 57-133325 | 8/1982 |
| JP | 63-185208 | 7/1988 |
| JP | 02-087709 | 3/1990 |
| JP | 06-084176 | 3/1994 |
| JP | 06-224652 | 8/1994 |
| JP | 09-509251 | 9/1997 |
| JP | 2000-261385 | 9/2000 |
| JP | 2000-357929 | 12/2000 |
| JP | 2001-004444 | 1/2001 |
| JP | 2008-510383 | 4/2008 |

OTHER PUBLICATIONS

International Search Report, PCT/JP2009/062051, Oct. 6, 2009.

* cited by examiner

*Primary Examiner* — Thanh Luu
(74) *Attorney, Agent, or Firm* — Young & Thompson

(57) ABSTRACT

A light amount detecting apparatus includes: a photoelectric converting element converting quantity of light inputted to current; a current/voltage converting device having a positive input terminal connected to a first terminal of the photoelectric converting element, a negative input terminal connected to a second terminal of the photoelectric converting element, a negative output terminal for reversing polarity of a current inputted to the positive input terminal and outputting it as a voltage, a positive output terminal for reversing polarity of a current inputted to the negative input terminal and outputting it as a voltage, a first negative feedback resistor connecting the positive and negative output terminals, and a second negative feedback resistor connected between the negative and positive output terminals, the current/voltage converting device setting the photoelectric converting element in zero bias and converting the converted current to the voltage; and an amplifying device for amplifying the converted voltage.

10 Claims, 11 Drawing Sheets

(a)

(b)

(c)

LIGHT AMOUNT DETECTING APPARATUS, AND LIGHT AMOUNT INFORMATION PROCESSING APPARATUS

TECHNICAL FIELD

The present invention relates to, for example, a light amount detecting apparatus such as a photoelectric converting apparatus for converting a small amount of light to an electrical signal, and a light amount information processing apparatus for processing a light detection signal according to the small amount of light.

BACKGROUND ART

As this type of apparatus, a patent document 1 or the like discloses a technology about a light receiving circuit for high-speed communication used for optical communication. Specifically, it discloses a technology in which a reverse bias voltage is applied to a photodiode by a bias element, thereby reducing capacitance between both terminals of the photodiode, and broadening a light detecting band.

PRIOR ART DOCUMENT

Patent Document

Patent document 1: Japanese Patent Application Laid Open No. Hei 6-224652
Patent document 2: Japanese Patent Application Laid Open No. 2000-261385
Patent document 3: Japanese Patent Application Laid Open No. 2000-357929
Patent document 4: Japanese Patent Application Laid Open No. Hei 6-84176
Patent document 5: Japanese Translation of PCT International Application (Tokuhyo) No. 2008-510383

DISCLOSURE OF INVENTION

Subject to be Solved by the Invention

In the aforementioned patent document 1 or the like, since the reverse bias voltage is applied in the photodiode, the capacitance between a P terminal and an N terminal can be reduced by the application of the reverse bias voltage; however, as an evil influence, even without the amount of light inputted, a current flowing in an opposite direction, i.e. a dark current, is generated, which is technically problematic. Thus, in a case where a current detected by the photodiode is a small amount of current due to a small change in the amount of light detected, if the application of the reverse bias voltage increases the dark current, then, a noise component increases, and that makes it hard to detect the small amount of light, which is also technically problematic.

In view of the aforementioned problems, it is therefore an object of the present invention to provide a light amount detecting apparatus capable of detecting a smaller amount of light and a light amount information processing apparatus.

Means for Solving the Subject

The above object of the present invention can be achieved by a light amount detecting apparatus provided with: a photoelectric converting element (e.g. a PIN diode) for converting amount of light inputted to a current; a current/voltage converting device having a positive input terminal connected to a first terminal of the photoelectric converting element, a negative input terminal connected to a second terminal of the photoelectric converting element, a negative output terminal for reversing polarity of a current inputted to the positive input terminal and outputting it as a voltage, a positive output terminal for reversing polarity of a current inputted to the negative input terminal and outputting it as a voltage, a first negative feedback resistor connected between the positive input terminal and the negative output terminal, and a second negative feedback resistor connected between the negative input terminal and the positive output terminal, the current/voltage converting device setting the photoelectric converting element in zero bias and converting the converted current to the voltage; and an amplifying device for amplifying the converted voltage.

According to the light amount detecting apparatus of the present invention, the amount of the light inputted is converted to the current by the photoelectric converting element such as, for example, a P-Intrinsic-N (PIN) diode.

The current/voltage converting device has the following six terminals, sets the photoelectric converting element in the zero bias, and converts the converted current to the voltage. Here, the "zero bias" of the present invention means a state of bias in which the reverse bias voltage is hardly applied or not applied at all to the photoelectric converting element. The current/voltage converting device has the positive input terminal connected to the first terminal, such as the P terminal, of the photoelectric converting element, the negative input terminal connected to the second terminal, such as the N terminal, of the photoelectric converting element, the negative output terminal for reversing the polarity of the current inputted to the positive input terminal and outputting it as the voltage, the positive output terminal for reversing the polarity of the current inputted to the negative input terminal and outputting it as the voltage, the first negative feedback resistor connected between the positive input terminal and the negative output terminal, and the second negative feedback resistor connected between the negative input terminal and the positive output terminal.

By the amplifying device, the converted voltage is amplified. By this, it is possible to output it as a light detection signal according to the amount of light received.

According to the present invention, as described above, the photoelectric converting element such as a PIN diode can be operated in the state of zero bias in which the reverse bias voltage is hardly applied or not applied at all to the photoelectric converting element, i.e. as a power generation mode. By this, the dark current can be almost or completely asymptotically brought close to zero. As a result, it is possible to reduce a noise current due to the fluctuation in the dark current and to improve an S/N ratio. Typically, for example, it is possible to detect a small amount of light and a small change in the amount of light caused by the scattering of light due to hemoglobin in blood.

In addition, according to the present invention, the action of zero bias application to the photoelectric converting element is performed by a negative feedback action by the first negative feedback resistor and the second negative feedback resistor. This can almost or completely eliminate a need to add a special bias element in order to set the photoelectric converting element in the state of zero bias. As a result, for example, in making Large Scale Integrated Circuits (LSI) of the light amount detecting apparatus, a chip area can be reduced. Thus, it is possible to reduce cost in manufacturing the light amount detecting apparatus.

If the potential of the second terminal such as the N terminal is set higher than the potential of the first terminal such as the P terminal on the photoelectric converting element and if the reverse bias voltage is applied, the capacitance between the first terminal and the second terminal can be reduced by the application of the reverse bias voltage; however, as an evil influence, even without the amount of light inputted, a current flowing in an opposite direction, i.e. the dark current, is generated. Thus, in a case where a current detected by the light receiving element is a small amount of current due to a small change in the amount of light detected, if the application of the reverse bias voltage increases the dark current, then, a noise component increases, and that makes it technically hard to detect the small amount of light and the small change in the amount of light. In other words, in comparison with a detected current signal, the noise current due to the fluctuation in the dark current increases, and the S/N ratio significantly decrease, which are technically problematic.

In one aspect of the light amount detecting apparatus of the present invention, the current/voltage converting device has a common negative feedback device for performing negative feedback on a potential difference between a reference potential and a midpoint potential of the negative output terminal and the positive output terminal. Incidentally, the common negative feedback device may include a midpoint potential detecting device for detecting the midpoint potential.

According to this aspect, by operating the photoelectric converting element in the state of zero bias, i.e. as the power generation mode, without electrically dividing the input bias of the current/voltage converting device and the bias of the photoelectric converting element, the input bias of the current/voltage converting device can be asymptotically brought close to the reference potential and be adjusted, by the cooperative action of the first negative feedback resistor, the second negative feedback resistor, and the common negative feedback device.

As a result, without adding the special bias element and a special condenser for electrically dividing the input bias of the current/voltage converting device and the bias of the photoelectric converting element, it is possible to optimize an operating point in differential amplification by the current/voltage converting device and to realize an improvement in the distortion characteristics. In addition, without adding the aforementioned special bias element and the special condenser for electrically dividing the bias, it is possible to improve a dynamic range on the light amount detecting apparatus.

Moreover, in addition, according to this aspect, since there is no need to provide the condenser on the light amount detecting apparatus, it can realize low cost. Moreover, since there is no need to provide the condenser, when the photoelectric converting element and the current/voltage converting device are formed on the same LSI, i.e. when so-called Optical Electric Integrated Circuits (OEIC) are made, a chip area can be reduced. Thus, it is possible to realize simple and low-cost LSI.

In another aspect of the light amount detecting apparatus of the present invention, the common negative feedback device equalizes a potential of the first terminal with a potential of the second terminal of the photoelectric converting element.

According to this aspect, the dark current in the photoelectric converting element can be almost or completely asymptotically brought close to zero. As a result, it is possible to reduce the noise current due to the fluctuation in the dark current and to further improve the S/N ratio. Typically, for example, it is possible to detect the small amount of light and the small change in the amount of light caused by the scattering of light due to hemoglobin in blood.

In another aspect of the light amount detecting apparatus of the present invention, the amplifying device differentially amplifies the voltage outputted by each of the negative output terminal and the positive output terminal.

According to this aspect, by the amplifying device such as, for example, an instrumentation amplifier, the voltage is differentially amplified via the negative output terminal and the positive output terminal. By this, on the basis of the light detection signal with an improved S/N ratio, the small amount of light and the small change in the amount of light can be detected, more accurately.

In another aspect of the light amount detecting apparatus of the present invention, it is further provided with: a modulating device for modulating a voltage signal of the converted voltage by reversing polarity of the converted voltage with an odd-numbered period defined by a predetermined frequency which is higher than a frequency of the converted current and by not reversing the polarity of the converted voltage with an even-numbered period defined by the predetermined frequency; and a demodulating device for demodulating the voltage signal of the converted voltage by reversing the polarity of the converted voltage with the even-numbered period and by not reversing the polarity of the converted voltage with the even-numbered period.

According to this aspect, the voltage of the current/voltage converting device is substantially equivalent to a waveform obtained by that the modulating device performs amplitude modulation at the predetermined frequency. By this, the current converted by the photoelectric converting element is current/voltage-converted while being modulated to an amplitude modulation wave having frequency spectrums of upper and lower frequencies, i.e. an upper side wave and a lower side wave, with the predetermined frequency as a carrier frequency. In particular, the predetermined frequency as the carrier frequency is higher than the frequency of the current converted by the photoelectric converting element. By this, the current/voltage conversion is performed during frequency conversion to the spectrum centered on the predetermined frequency as the carrier frequency. Thus, an influence of a "1/f noise" generated by an amplifier used for this current/voltage conversion, i.e. a low-frequency noise, can be almost or completely eliminated.

In other words, the low-frequency noise is mainly the "1/f noise" of the amplifier in the current/voltage converting device for mainly performing the differential amplification and has a tendency of decreasing with an increase in frequency. Then, by performing the current/voltage conversion while the modulating device modulates the converted voltage at the predetermined frequency, which is higher than the frequency of the current converted by the photoelectric converting element, it is possible to almost or completely eliminate the influence of the low-frequency noise.

As a result, it is possible to improve the S/N ratio of the light detection signal while almost or completely eliminating the influence of the "1/f noise" of the current/voltage converting device for performing the differential amplification. Consequently, since the light detection characteristics (or light detection performance) in a low-frequency area is remarkably excellent, it is possible to detect the amount of light from a photo sensor for measuring a weak signal including a low-frequency component such as, for example, a blood flow signal, more accurately and appropriately.

Now, regarding a technical problem which occurs if the modulation and the demodulation by the modulating device and the demodulating device described above are not performed, an explanation will be given on a case where the current converted by the photoelectric converting element has a colored spectrum with a center frequency of fs, as one example. On the colored spectrum with a center frequency of fs, the current/voltage conversion is performed without change. In this case, the current/voltage converting device for performing the differential amplification generates the low-frequency noise referred to as the so-called "1/f noise". The low-frequency noise has such a tendency that the degree of the noise increases with a reduction in frequency. Thus, in the current/voltage conversion, this "1/f noise" is added to the signal component of the frequency fs and the current/voltage conversion is performed. Thus, if the modulation and the demodulation by the modulating device and the demodulating device described above are not performed, that likely causes such a technical problem that the S/N ratio is remarkably reduced.

In another aspect of the light amount detecting apparatus of the present invention, it is further provided with, as the modulating device: a first switching device for changing between a first connection state and a second connection state at the predetermined frequency, wherein in the first connection state, the first terminal and the positive input terminal are connected and the second terminal and the negative input terminal are connected, and in the second connection state, the first terminal and the negative input terminal are connected and the second terminal and the positive input terminal are connected.

According to this aspect, by a switch action by the first switching device, the aforementioned modulation can be performed, appropriately.

In another aspect of the light amount detecting apparatus of the present invention, it is further provided with, as the modulating device: a second switching device for changing between a third connection state and a fourth connection state at the predetermined frequency, wherein in the third connection state, the negative output terminal and the first negative feedback resistor are connected and the positive output terminal and the second negative feedback resistor are connected, and in the fourth connection state, the negative output terminal and the second negative feedback resistor are connected and the positive output terminal and the first negative feedback resistor are connected.

According to this aspect, by a switch action by the second switching device in addition to the first switching device described above, the aforementioned modulation can be performed, appropriately.

In another aspect of the light amount detecting apparatus of the present invention, the amplifying device includes a subtraction amplifying device for differentially amplifying a negative detection voltage outputted by the negative output terminal and a positive detection voltage outputted by the positive output terminal, and the light amount detecting apparatus is further provided with a third switching device for reversing polarities of the negative detection voltage and the positive detection voltage at the predetermined frequency, as the demodulating device.

According to this aspect, by a switch action by the third switching device, the aforementioned modulation can be performed, appropriately.

In another aspect of the light amount detecting apparatus of the present invention, the amplifying device includes a delaying device for delaying timing of demodulating the voltage signal of the converted voltage by a predetermined time.

According to this aspect, by a delay action for delaying demodulation timing by the predetermined time performed by the delaying device, it is possible to effectively prevent the residual of the harmonic component of the carrier frequency in the demodulation, which is caused by a time difference between modulation timing by the modulating device and the demodulation timing by the demodulating device. As a result, it is possible to effectively suppress a high-frequency noise generated in the demodulation, and it is possible to realize a further improvement in the S/N ratio of the light detection signal.

In another aspect of the light amount detecting apparatus of the present invention, it is further provided with a high-frequency pass filtering device for removing a low-frequency noise of the voltage signal of the voltage modulated.

According to this aspect, since the low-frequency noise such as the "1/f noise" described above, which exists after the modulation and before the demodulation, can be appropriately removed by the high-frequency pass filtering device and then demodulated, the S/N ratio of the light detection signal can be improved, significantly. Thus, it is extremely preferable in practice.

In another aspect of the light amount detecting apparatus of the present invention, it is further provided with a low-frequency pass filtering device for removing a high-frequency noise of the voltage signal of the voltage demodulated.

According to this aspect, since the high-frequency noise such as a carrier frequency component which cannot be removed in the demodulation can be removed by the low-frequency pass filtering device, the S/N ratio of the light detection signal can be improved, more significantly. Thus, it is further extremely preferable in practice.

The above object of the present invention can be also achieved by a light amount information processing apparatus provided with: the light amount detecting apparatus of the present invention described above; and a signal processing device for processing a light detection signal which is a voltage signal of the amplified voltage.

According to the light amount information processing apparatus of the present invention, it is possible to receive various benefits of the light amount detecting apparatus of the present invention described above while appropriately processing the light detection signal which is the voltage signal of the amplified voltage. Typically, since the light detection signal is quantized by the signal processing device, it is resistant to a noise from an outer world environment in the case of transmission performed via a communication network. Thus, it can realize the long distance transmission of the light detection signal.

Incidentally, in response to the various aspects of the light amount detecting apparatus of the present invention described above, the light amount information processing apparatus of the present invention can also adopt various aspects.

MODE FOR CARRYING OUT THE INVENTION

Hereinafter, the best mode for carrying out the present invention will be explained with reference to the drawings.

<First Embodiment>
<Entire Structure: Light Amount Detecting Apparatus>

Figure 1:
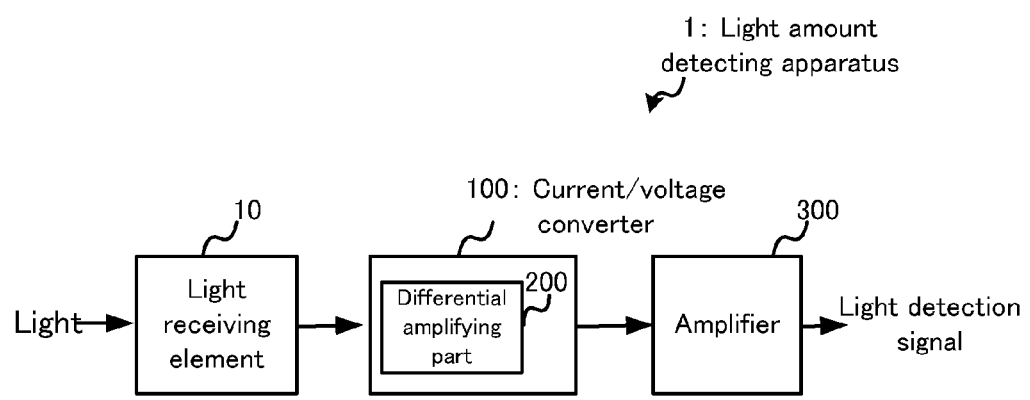
FIG. 1 is a block diagram conceptually showing the entire structure of a light amount detecting apparatus 1 in a first embodiment.
Figure 2:
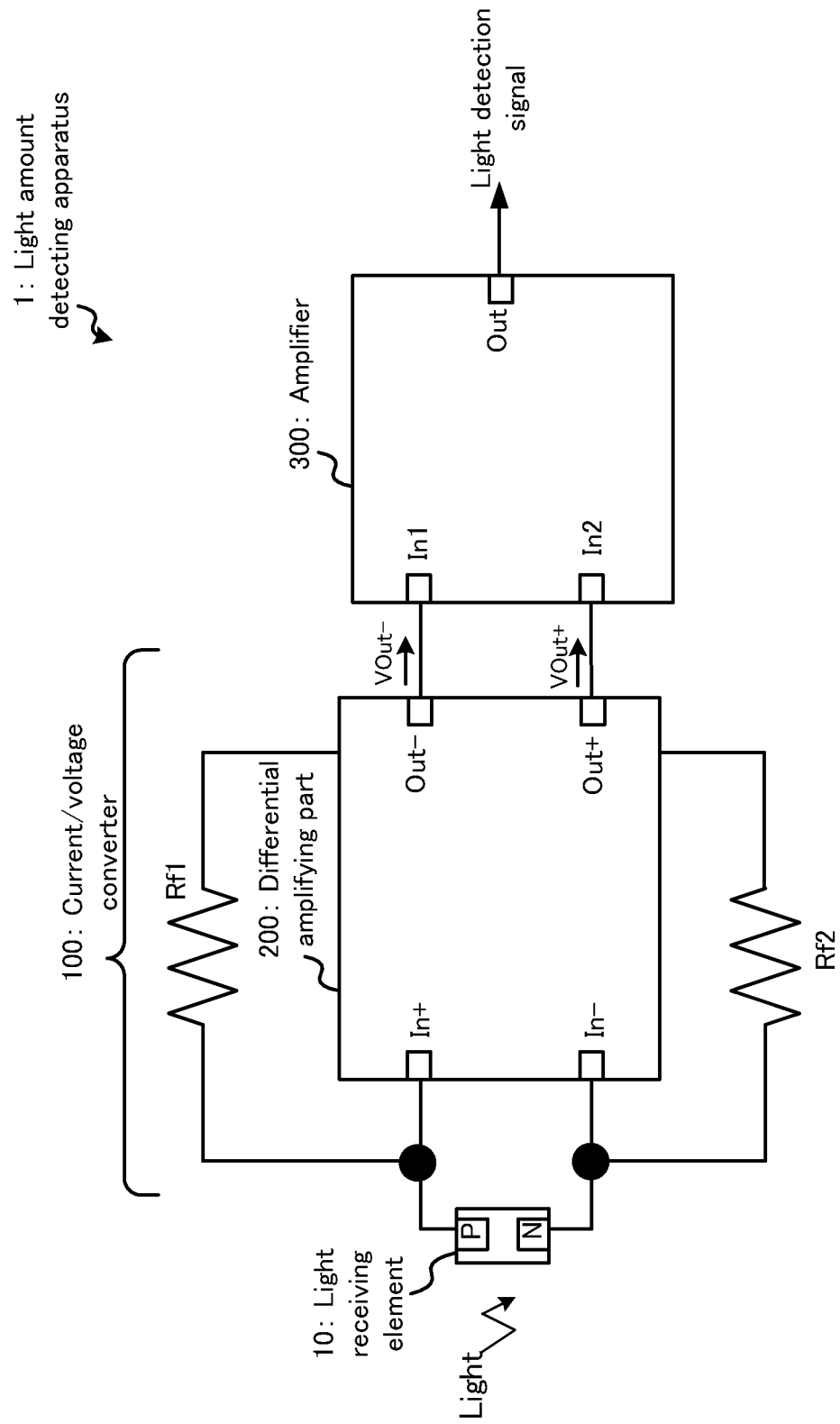
FIG. 2 is a block diagram schematically showing the detailed structure of the light amount detecting apparatus 1 in the first embodiment.

Firstly, with reference to FIG. 1 and FIG. 2, the basic configuration of a first embodiment of the present invention will be explained. FIG. 1 is a block diagram conceptually showing the entire structure of a light amount detecting apparatus 1 in a first embodiment. FIG. 2 is a block diagram schematically showing the detailed structure of the light amount detecting apparatus 1 in the first embodiment.

As shown in FIG. 1 and FIG. 2, the light amount detecting apparatus 1 in the first embodiment is provided with a light receiving element 10, a current/voltage converter 100 including a differential amplifying part 200, and an amplifier 300. The current/voltage converter 100 is provided with the differential amplifying part 200 and feedback resistors Rf1 and Rf2. The amplifier 300 is provided with input terminal In1 and In2 and an output terminal Out.

The light receiving element 10 receives a small amount of light inputted from the exterior and outputs a detection current in accordance with the amount of light received. Typically, the light receiving element 10 is a photodiode such as, for example, a PIN diode. Both ends of the light receiving element 10 are connected to input terminals In+ and In− of the differential amplifying part 200 of the current/voltage converter 100, respectively. Specifically, a P-type semiconductor of the light receiving element 10 is connected to the input terminal In+ of the differential amplifying part 200 of the current/voltage converter 100. Moreover, an N-type semiconductor of the light receiving element 10 is connected to the input terminal In− of the differential amplifying part 200 of the current/voltage converter 100.

The current/voltage converter 100 current/voltage-converts the detection current detected by the light receiving element 10 by the action of the feedback resistors Rf1 and Rf2 and differentially outputs detection voltages Vout− and Vout+, which are different in signal polarity, via output terminals Out− and Out+. The feedback resistor Rf1 is connected between the output terminal In+ and the output terminal Out− of the differential amplifying part 200 of the current/voltage converter 100. The feedback resistor Rf2 is connected between the input terminal In− and the output terminal Out+. The feedback resistors Rf1 and Rf2 perform negative feedback and simultaneously convert the current to the voltage.

The detection voltages Vout− and Vout+ of the differential amplifying part 200 of the current/voltage converter 100 are inputted to the internal terminals In1 and In2 of the amplifier 300, respectively. The amplifier 300 amplifies the inputted voltage and outputs a light detection signal.

Incidentally, the light receiving element 10 constitutes one example of the photoelectric converting element of the present invention. Moreover, the current/voltage converter 100 constitutes one example of the current/voltage converting device of the present invention. The feedback resistors Rf1 and Rf2 constitute one example of the first negative feedback resistor and the second negative feedback resistor of the present invention, respectively. Moreover, the amplifier 300 constitutes one example of the amplifying device of the present invention.

<Detailed Structure: Current/Voltage Converter>

Figure 3:
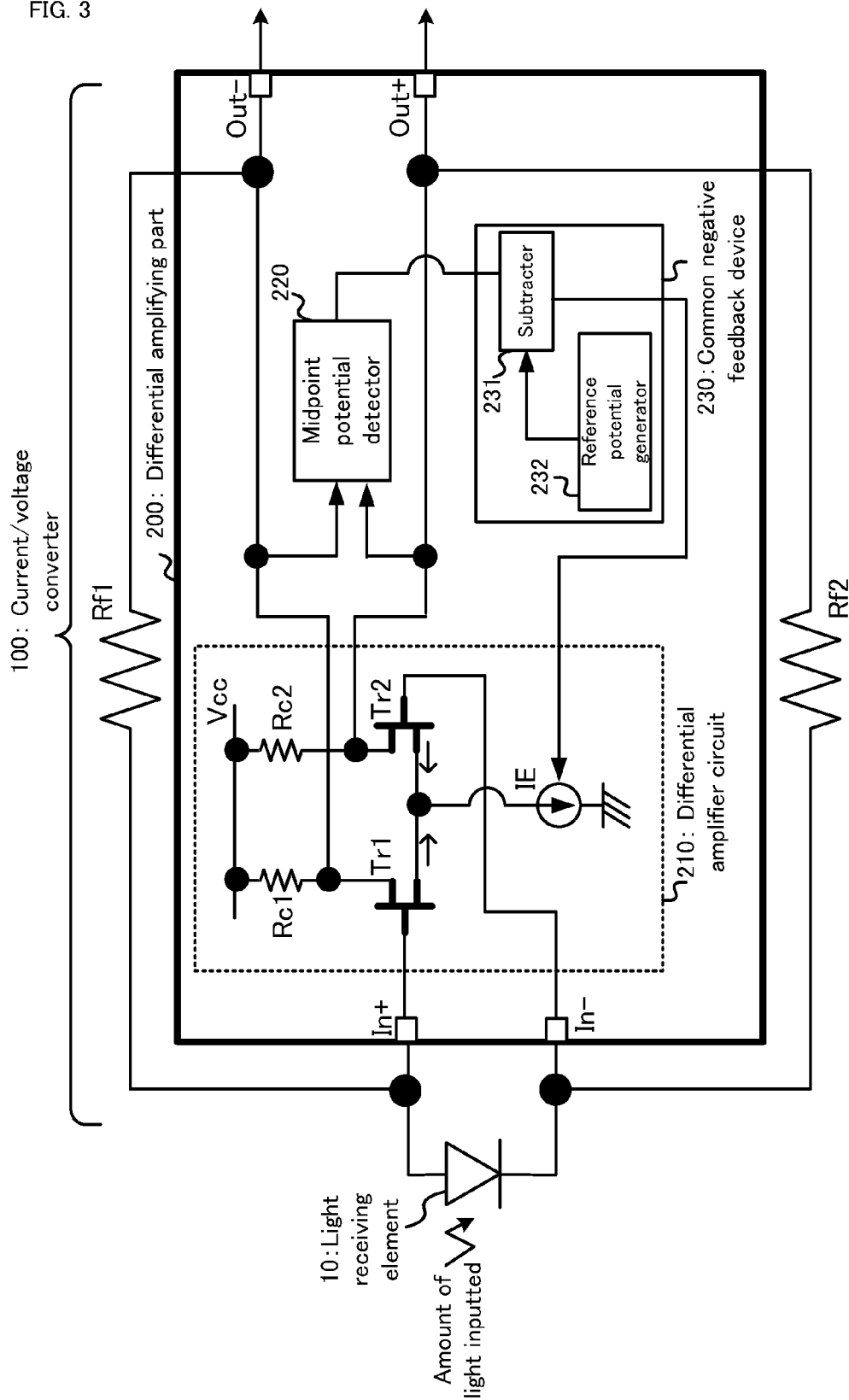
FIG. 3 is a block diagram schematically showing the detailed structure of a current/voltage converter 100 in the first embodiment.

Next, with reference to FIG. 3, the detailed structure of the current/voltage converter 100 in the first embodiment will be explained. FIG. 3 is a block diagram schematically showing the detailed structure of the current/voltage converter 100 in the first embodiment.

As described above, the current/voltage converter 100 is provided with the feedback resistors Rf1 and Rf2 and the differential amplifying part 200.

As described above, the feedback resistor Rf1 is connected between the input terminal In+ and the output terminal Out− of the differential amplifying part 200 of the current/voltage converter 100. The feedback resistor Rf2 is connected between the input terminal In− and the output terminal Out+. The feedback resistors Rf1 and Rf2 perform the negative feedback and simultaneously convert the current to the voltage.

The differential amplifying part 200 is provided with the input terminals In+ and In−, a differential amplifier circuit 210, a midpoint potential detector 220, a common negative feedback part 230, and the output terminals Out+ and Out−.

The differential amplifier circuit 210 is provided with transistors Tr1 and Tr2, a power supply voltage Vcc, load resistors Rc1 and Rc2, and a constant current source IE. The input terminals In+ and In− of the differential amplifying part 200 are connected to the bases of transistors Tr1 and Tr2 of the differential amplifier circuit 210, respectively, as the differential input of the differential amplifier circuit 210. The constant current source IE is connected between a ground point and a connection point of each emitter of the transistors Tr1 and Tr2. The load resistors Rc1 and Rc2 are connected between the power supply voltage Vcc and each corrector of the transistors Tr1 and Tr2, respectively, and the connection points are derived as the output terminals Out− and Out+.

Each of the two differential outputs of the differential amplifier circuit 210 is inputted to the midpoint potential detector 220.

The midpoint potential detector 220 detects the midpoint potential of the two differential outputs of the differential amplifier circuit 210 and outputs a detected signal. The signal outputted from the midpoint potential detector 220 is inputted to the common negative feedback part 230.

The common negative feedback part 230 is provided with a subtracter 231 and a reference potential generator 232. The subtracter 231 compares a reference potential generated by the reference potential generator 232 with the midpoint potential detected by the midpoint potential detector 220 and outputs a signal of their potential difference. Incidentally, the reference potential may be a reference potential inputted from the exterior of the common negative feedback part 230.

The signal of the potential difference outputted from the common negative feedback part 230 is inputted to a control terminal for setting a current value of the constant current source IE of the differential amplifier circuit. Incidentally, the midpoint potential detector 220 constitutes one example of the midpoint detecting device of the present invention. Moreover, the common negative feedback part 230 constitutes one example of the common negative feedback device of the present invention.

<Detailed Structure: Amplifier>

Figure 4:
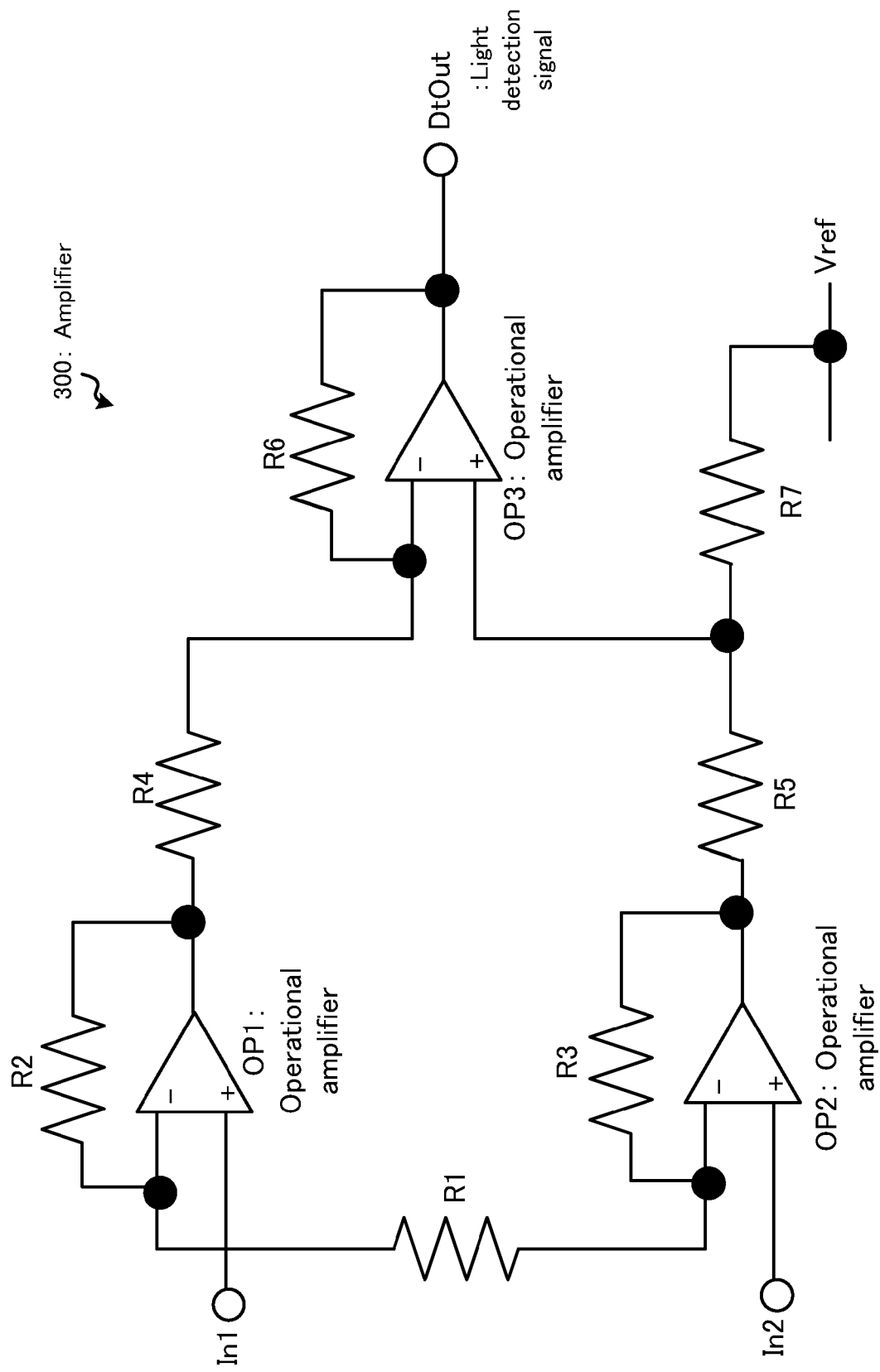
FIG. 4 is a circuit diagram schematically showing the detailed structure of an amplifier 300 in the first embodiment.

Next, with reference to FIG. 4, the detailed structure of the amplifier 300 in the first embodiment will be explained. FIG. 4 is a circuit diagram schematically showing the detailed structure of the amplifier 300 in the first embodiment.

As shown in FIG. 4, the amplifier 300 is provided with: operational amplifiers (hereinafter referred to as "amplifiers" as occasion demands) OP1, OP2, and OP3, which are operating amplifiers; feedback resistors R2, R3, and R6; common input resistor R1; input resistors R4, R5, and R7.

The input terminal In1 and In2 of the amplifier 300 are connected to the plus input terminals of the amplifiers OP1 and OP2, respectively. The amplifiers OP1 and OP2 are subjected to the negative feedback by the feedback resistors R2 and R3, respectively.

The common input resistor R1 is disposed between the minus input terminal of the amplifier OP1 and the minus input terminal of the amplifier OP2. Incidentally, the common input resistor R1 may function as a variable resistor for varying gain.

The feedback resistors R2 and R3 are set to have an equal resistance value.

The output of the amplifier OP1 is connected to the minus input terminal of the amplifier OP3 via the input resistor R4. In substantially the same manner, the output of the amplifier OP2 is connected to the plus input terminal of the amplifier OP3 via the input resistor R5.

The input resistors R4 and R5 are set to have an equal resistance value.

The amplifier OP3 is subjected to the negative feedback by the feedback resistor R6.

The component of a signal outputted from the amplifier OP2 is divided by the input resistor R5 and the input resistor R7 and is inputted to the plus input terminal of the amplifier OP3.

The other terminal of the input resistor R7 is connected to a reference potential Vref.

The feedback resistor R6 and the input resistor R7 are set to have an equal resistance value.

The output of the amplifier OP3 is outputted as a light detection signal DtOut.

In particular, as shown in FIG. 4, the amplifier 300 is configured as, for example, an instrumentation amplifier, and it amplifies a potential difference between a voltage inputted from the input terminal In1 and a voltage inputted from the input terminal In2. By this, of the two differential outputs outputted from the current/voltage converter 100, an in-phase signal component can be removed as a noise. In addition, at the two output terminals Out− and Out+ of the current/voltage converter 100, two differential signals which are different in polarity are outputted in accordance with the amount of light inputted to the light receiving element 10 such as a photodiode, as described above, and the signal components of light detected are inputted in reverse phase to the input terminals In1 and In2 of the amplifier 300. By this, from the light detection signal DtOut outputted from the amplifier 300, for example, the in-phase component, such as a hamming noise from a power supply, can be removed as a noise. In addition, since the signal components of light detected are in reverse phase, the signal components of light detected are amplified by the amplifier 300 and outputted as the light detection signal DtOut. As a result, the degree of the noise decreases, and the degree of the signal increases. Thus, it is possible to remarkably improve an S/N ratio.

In addition, by configuring the amplifier 300 as the instrumentation amplifier as described above, it is possible to increase input impedance and to reduce output impedance, and it is possible to increase a Common Mode Rejection Rate (CMPR). As a result, a voltage difference between the potential of the input terminal In1 and the potential of the input terminal In2 can be differentially amplified more appropriately, and a more appropriate light detection signal DtOut can be outputted.

<Operating Principle: Light Amount Detecting Apparatus>

Next, with reference to FIG. 3 and FIG. 4 described above, the operating principle of the light amount detecting apparatus in the first embodiment will be explained.

As shown in FIG. 3 described above, the light receiving element 10 is made of a photodiode such as a PIN diode. The P-type semiconductor, i.e. P terminal, of the light receiving element 10 such as a photodiode is connected to the input terminal In+ of the differential amplifying part 200 of the current/voltage converter 100. Moreover, the N-type semiconductor, i.e. N terminal, of the light receiving element 10 is connected to the input terminal In− of the differential amplifying part 200 of the current/voltage converter 100. The input terminals In+ and In− of the differential amplifying part 200 are connected to the bases of the transistors Tr1 and Tr2 of the differential amplifier circuit 210, respectively, as the differential input of the differential amplifier circuit 210.

The differential output of the differential input on the input terminal In+ side of the differential amplifier circuit 210 is subjected to the negative feedback by the feedback resistor Rf1. In addition, the differential output of the differential input on the input terminal In− side of the differential amplifier circuit 210 is subjected to the negative feedback by the feedback resistor Rf2.

Specifically, for example, if light is inputted to the light receiving element such as a photodiode, a negative voltage is generated at the P terminal. As a result, an opposite-direction current flows in accordance with the amount of light, and this current becomes the detection current of the light receiving element. The detection current flows from the P terminal of the photodiode, i.e. the input terminal In+ of the differential amplifying part 200, to the feedback resistor Rf1, and a voltage drop due to Rf1 reduces the potential of the output terminal Out− of the differential amplifying part 200 of the current/voltage converter 100. Moreover, the detection current flows from the feedback resistor Rf2 to the N terminal of the photodiode, i.e. the input terminal In−, and a voltage drop due to Rf2 increases the potential of the output terminal Out+ of the differential amplifying part 200 of the current/voltage converter 100. By this, since the potential of the output terminal Out− of the differential amplifying part 200 of the current/voltage converter 100 decreases and the potential of the output terminal Out+ of the differential amplifying part 200 increases in accordance with the amount of light inputted to the photodiode, differential output signals which are different in polarity are obtained. In particular, the input resistance value of the differential amplifying part 200 can be designed to be higher than the resistance values of the feedback resistors Rf1 and Rf2, and the current flowing into the input terminals In+ and In− of the differential amplifying part 200 can be ignored.

Moreover, each of the two differential outputs of the differential amplifying part 200 is inputted to the midpoint potential detector 220, and the midpoint potential of the two differential outputs of the differential amplifying part 200 is detected.

On the common negative feedback part 230, as described above, the detected midpoint potential is compared with the reference potential by the subtracter 231 and the reference potential generator 232 described above, and its potential difference is negatively fed back to the control terminal of the constant current source IE for generating the bias of the differential amplifier circuit 210. By this, it is appropriately controlled to the bias of the differential amplifier circuit 210.

As described above, due to two types of negative feedback actions, which are a first negative action by the feedback resistors Rf1 and Rf2 and a second negative feedback action by the common negative feedback part 230, it is possible to asymptotically bringing the potential of the input terminal of the differential amplifier circuit 210 close to the reference potential. By this, each of the potential of the input terminal In+ and the potential of the input terminal In− of the differential amplifying part 200 of the current/voltage converter 100 can be asymptotically brought close to the reference potential of the common negative feedback part 230. By this, the potential of the input terminal In+ and the potential of the input terminal In− of the differential amplifying part 200 of the current/voltage converter 100 can be made substantially equal.

This makes it possible to equalize the potential of the P terminal with the potential of the N terminal of the light receiving element 10 such as a PIN diode. By this, the light receiving element 10 such as a PIN diode can be operated as the zero bias, i.e. the power generation mode.

Since the potential of the P terminal and the potential of the N terminal of the light receiving element 10 are equalized, a connection relation between the P terminal or N terminal of the light receiving element 10 and the input terminal In+ or In− of the differential amplifying part 200 of the current/ voltage converter 100 is not limited to this embodiment. In other words, the P terminal of the light receiving element 10 may be connected to the input terminal In− of the differential amplifying part 200, and the N terminal of the light receiving element 10 may be connected to the input terminal In+ of the differential amplifying part 200.

As a result, it is possible to reduce a noise current due to fluctuation in the dark current caused by the reverse bias voltage and to improve the S/N ratio. In particular, according to the study by the present inventors or the like, it is revealed, for example, that a small amount of light and a small change in the amount of light caused by the scattering of light due to hemoglobin in blood can be detected by virtue of this embodiment.

<Examination on Action and Effect in First Embodiment>

Figure 5:
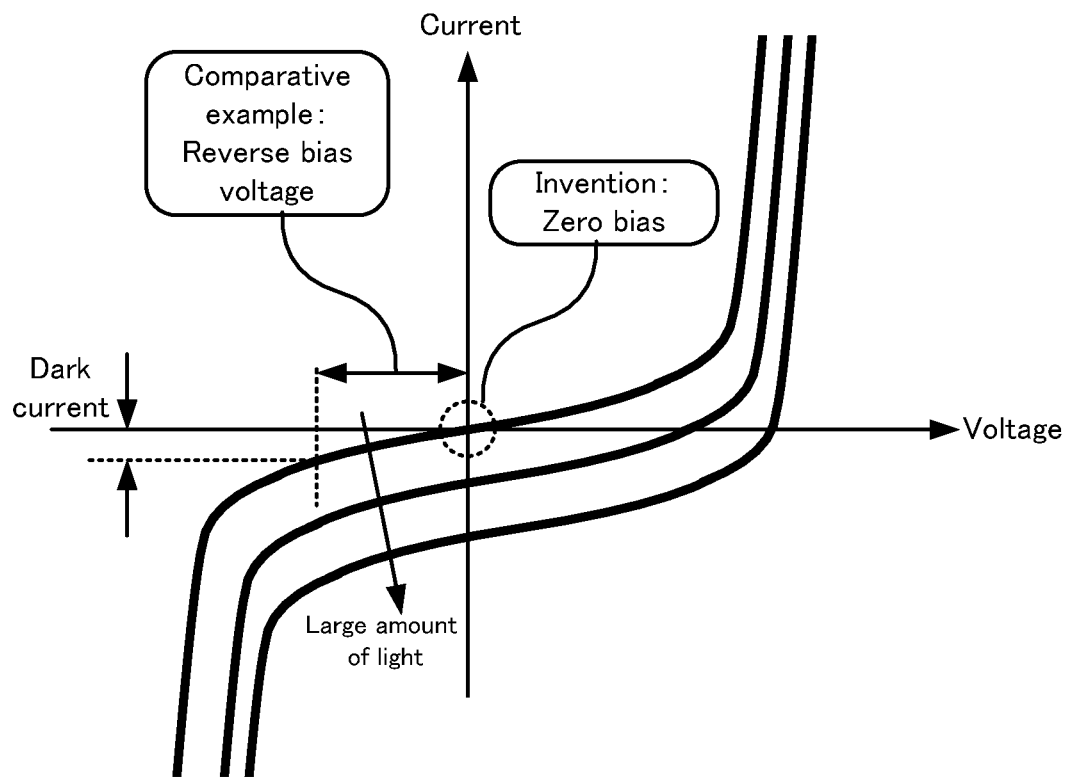
FIG. 5 are a graph schematically showing zero bias in the first embodiment and a reverse bias voltage in a comparative example (FIG. 5(a)), a circuit diagram showing a light receiving element in the comparative example (FIG. 5(b)), and a circuit diagram showing a light receiving element in the first embodiment (FIG. 5(c)).
Figure 5:
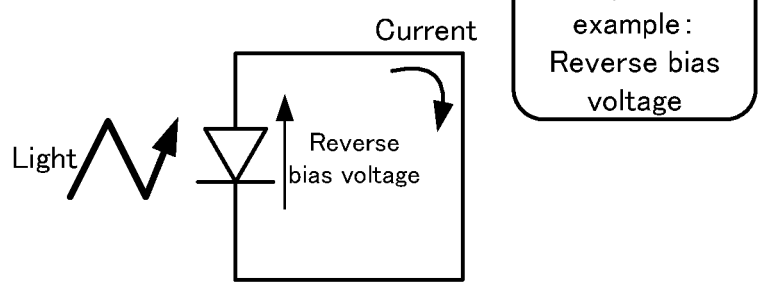
Figure 5:
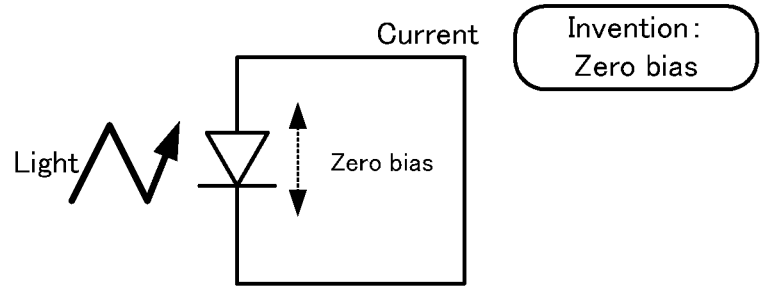

Next, in addition to FIG. 5, with reference to FIG. 3 and the like described above, as occasion demands, the operation and effect of the light amount detecting apparatus in the first embodiment will be examined. FIG. 5 are a graph schematically showing the zero bias in the first embodiment and the reverse bias voltage in a comparative example (FIG. 5(*a*)), a circuit diagram showing a light receiving element in the comparative example (FIG. 5(*b*)), and a circuit diagram showing the light receiving element in the first embodiment (FIG. 5(*c*)). Incidentally, the horizontal axis in FIG. 5(*a*) shows the voltage of the photodiode, and the vertical axis shows the current of the photodiode.

If, as shown in FIG. 5(*a*) and FIG. 5(*b*) in the comparative example, for example, the potential of the N terminal is set higher than the potential of the P terminal on the light receiving element such as a photodiode and if the reverse bias voltage is applied, the capacitance between the P terminal and the N terminal can be reduced by the application of the reverse bias voltage; however, as an evil influence, even without the amount of light inputted, a current flowing in an opposite direction, i.e. the dark current, is generated. Thus, in a case where a current detected by the light receiving element is a small amount of current due to a small change in the amount of light detected, if the application of the reverse bias voltage increases the dark current, then, a noise component increases, and that makes it technically hard to detect the small amount of light and the small change in the amount of light. In other words, in comparison with a detected current signal, the noise current due to the fluctuation in the dark current increases, and the S/N ratio significantly decrease, which are technically problematic.

In contrast, according to the embodiment, as shown in FIG. 5(*a*) and FIG. 5(*c*), the light receiving element 10 such as, for example, a PIN diode, can be operated in the state of zero bias in which the reverse bias voltage is hardly applied or not applied at all to the light receiving element 10, i.e. as the power generation mode. By this, the dark current can be almost or completely asymptotically brought close to zero. As a result, it is possible to reduce the noise current due to the fluctuation in the dark current and to improve the S/N ratio. Moreover, for example, it is possible to detect the small amount of light and the small change in the amount of light caused by the scattering of light due to hemoglobin in blood.

In addition, according to the embodiment, the action of bias application to the photodiode is performed by the negative feedback action by the feedback resistors Rf1 and Rf2, as shown in FIG. 3. This can almost or completely eliminate a need to add a special bias element exclusive for setting it in this zero bias in the bias application to the photodiode. As a result, for example, in making Large Scale Integrated Circuits (LSI) of the light amount detecting apparatus, a chip area can be reduced. Thus, it is possible to reduce cost in manufacturing the light amount detecting apparatus.

In addition, according to the embodiment, as described above, the light receiving element such as a photodiode can be operated in the state of zero bias, i.e. as the power generation mode. By this, as shown in FIG. 3, without electrically dividing the input bias of the differential amplifier circuit 210 and the bias of the light receiving element such as a photodiode, the input bias of the differential amplifier circuit 210 can be asymptotically brought close to the reference potential and be adjusted, by the cooperative action of the feedback resistors Rf1 and Rf2, the midpoint potential detector, and the common negative feedback part. As a result, without adding the aforementioned special bias element and a special condenser for electrically dividing the input bias of the differential amplifier circuit 210 and the bias of the light receiving element, it is possible to realize an improvement in the distortion characteristics of the differential amplifier circuit 210. In addition, without adding the aforementioned special bias element and the special condenser for electrically dividing the bias, it is possible to improve a dynamic range on the light amount detecting apparatus.

Moreover, in addition, according to the embodiment, since there is no need to provide the condenser for dividing the bias on the light amount detecting apparatus, it can realize low cost. Moreover, since there is no need to provide the condenser for dividing the bias, for example, when the light receiving element 10 such as a photodiode and the differential amplifier circuit 210 are formed on the same LSI, i.e. when so-called Optical Electric Integrated Circuits (OEIC) are made, a chip area can be reduced. Thus, it is possible to realize simple and low-cost LSI.

<Second Embodiment: Amplifier>

Figure 6:
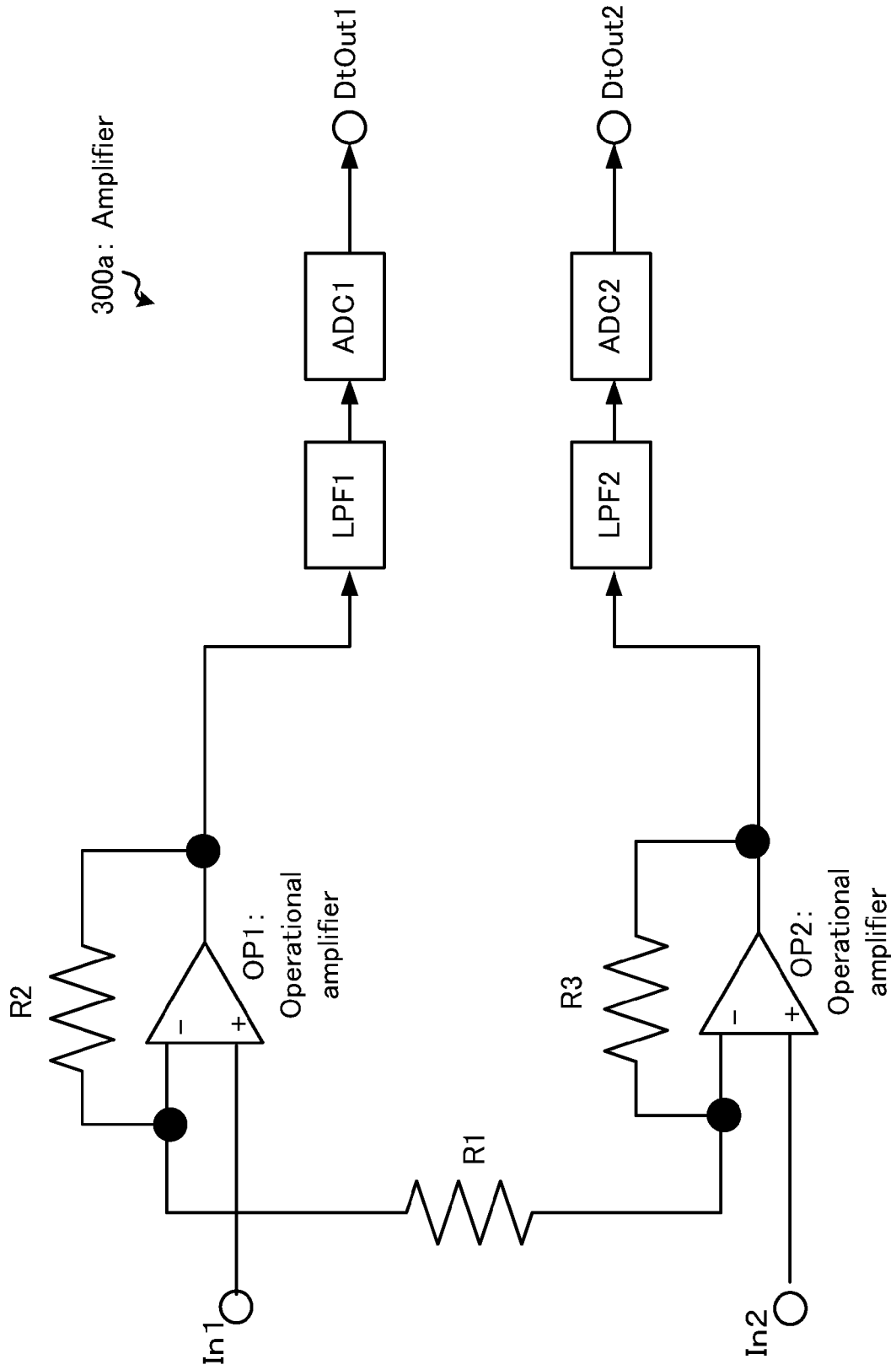
FIG. 6 is a circuit diagram schematically showing the detailed structure of an amplifier 300a in a second embodiment.

Next, the detailed structure of an amplifier 300a in a second embodiment will be explained. FIG. 6 is a circuit diagram schematically showing the detailed structure of the amplifier 300a in the second embodiment. Incidentally, in the amplifier 300a in the second embodiment, substantially the same constituents as those of the amplifier 300 in the first embodiment described above will carry the same reference numerals, and the explanation thereof will be omitted, as occasion demands. Moreover, since a light receiving element 10 and a current/voltage converter 100 in the second embodiment are substantially the same as the light receiving element 10 and the current/voltage converter 100 in the first embodiment, their explanation will be limited for convenience sake.

As shown in FIG. 6, the amplifier 300a in the second embodiment is provided with operational amplifiers OP1 and OP2, feedback resistors R2 and R3, a common input resistor R1, low pass filters (i.e. low-frequency pass filters) LPF1 and LPF2, and Analog to Digital (AD) converters ADC1 and ADC2.

As described above, the amplifier 300 in the first embodiment (refer to FIG. 4) can output the light detection signal DtOut which is a single end signal and which is an analog signal. In contrast, the amplifier 300a in the second embodiment may differentially output two differential signals which are different in polarity, as light detection signals DtOut1 and DtOut2. In addition, as shown in FIG. 6, they may be outputted as digital signals via the low pass filters LPF1 and LPF2 and the AD converters ADC1 and ADC2 described above. As described above, if the light detection signals DtOut1 and DtOut2 are outputted as the digital signals, the S/N ratio can be increased by inputting them to the AD converters ADC1 and ADC2 via the low pass filters LPF1 and LPF2 which are anti alias filters capable of removing an aliasing noise generated by sampling performed by the AD converters. Thus, it is extremely preferable and useful. With regard to the light detection signals DtOut1 and DtOut2 which are the output signals of the AD converters ADC1 and ADC2 and which are quantized, a subtraction process may be performed by a signal processing apparatus (not illustrated) such as a digital signal processing apparatus like a Digital Signal Processor (DSP).

As a result, according to the amplifier 300a in the second embodiment, since the light detection signals DtOut1 and DtOut2 are quantized, it is resistant to a noise from an outer world environment in the case of transmission performed via a communication network. Thus, it can realize the long distance transmission of the light detection signal.

<Third Embodiment>

Next, with reference to FIG. 7 to FIG. 10, a light amount detecting apparatus 1 in a third embodiment will be explained. Incidentally, regarding the constituents in the third embodiment, the constituents which are substantially the same as those in the first and second embodiments described above will carry the same reference numerals, and the explanation thereof will be omitted as occasion demands.

<Detailed Structure: Current/Voltage Converter>

Figure 7:
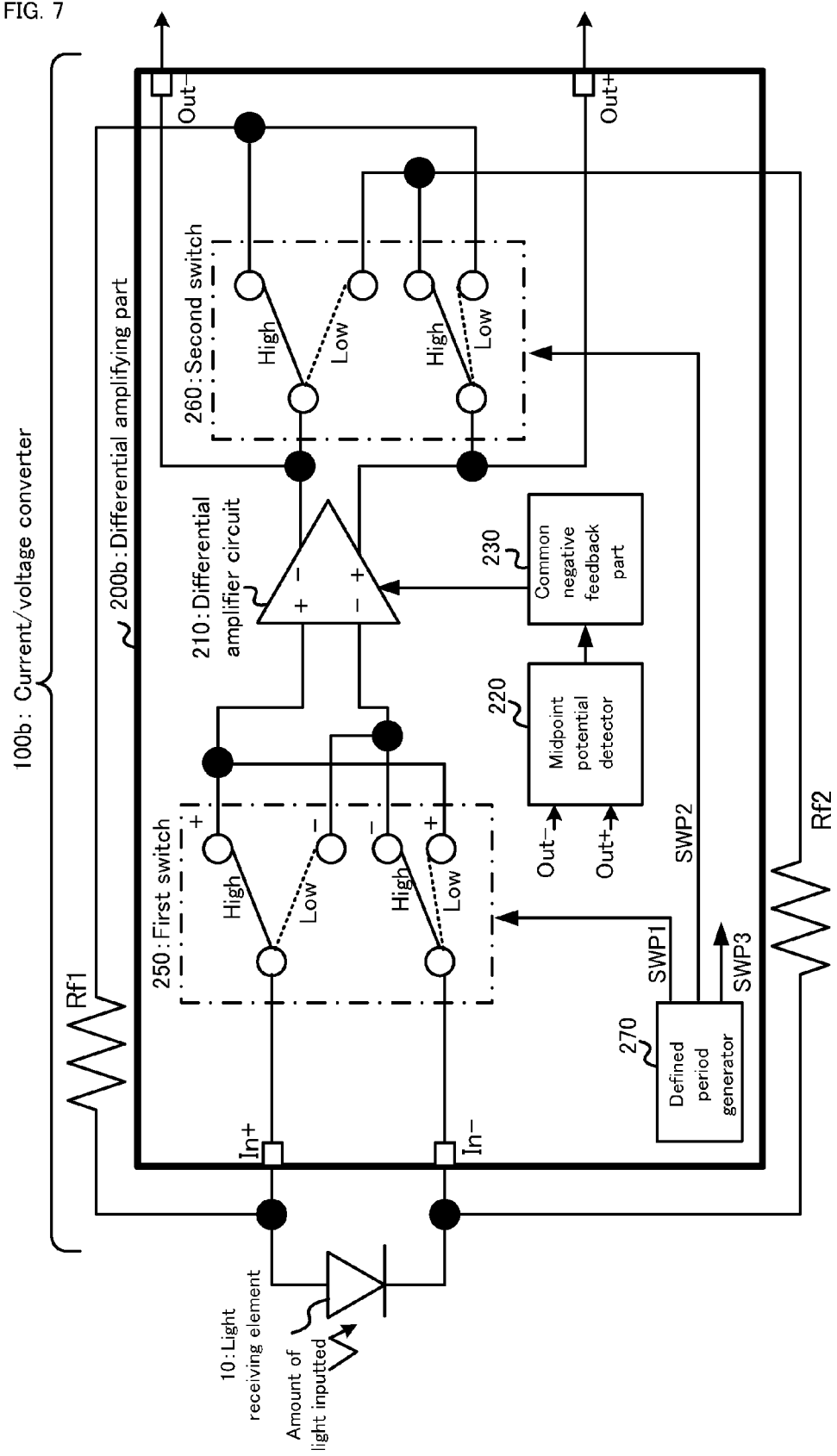
FIG. 7 is a block diagram schematically showing the detailed structure of a current/voltage converter 100b in a third embodiment.
Figure 9:
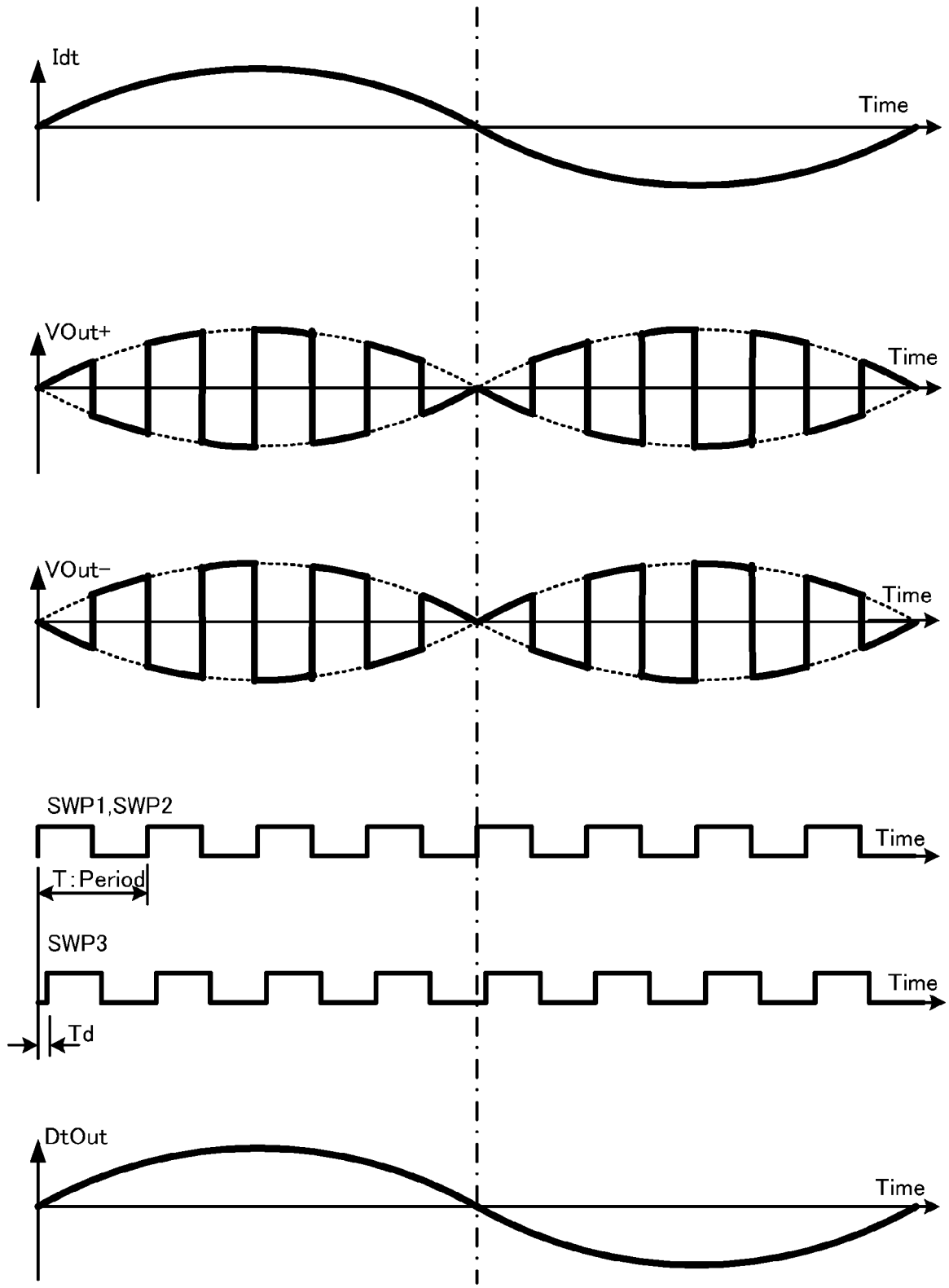
FIG. 9 is waveform diagrams along a time axis showing a detection current Idt of a light receiving element, detection voltages Vout+ and Vout−, control signals of a switch action SWP1, SWP2, and SWP3, and a light detection signal DtOut in the third embodiment.

Firstly, with reference to FIG. 7 and FIG. 9, the detailed structure of a current/voltage converter 100b in the third embodiment and modulation on the current/voltage converter 100b will be explained. FIG. 7 is a block diagram schematically showing the detailed structure of the current/voltage converter 100b in the third embodiment. FIG. 9 is waveform diagrams along a time axis showing a detection current Idt of a light receiving element, detection voltages Vout+ and Vout−, control signals of a switch action SWP1, SWP2, and SWP3, and a light detection signal DtOut in the third embodiment.

As shown in FIG. 7, the current/voltage converter 100b in the third embodiment is provided with feedback resistors Rf1 and Rf2 and a differential amplifying part 200b.

The feedback resistors Rf1 and Rf2 are connected between the input terminals In+ and In− and the output terminals Out− and Out+ of the differential amplifying part 200b of the current/voltage converter 100b, respectively. The feedback resistors Rf1 and Rf2 perform the negative feedback and simultaneously convert the current to the voltage.

The differential amplifying part 200b is provided with the input terminals In+ and In−, a first switch 250, a differential amplifier circuit 210, a second switch 260, a midpoint potential detector 220, a common negative feedback part 230, the output terminals Out+ and Out−, and a defined period generator 270. In particular, the first switch 250 is disposed between the input terminals In+ and In− and the differential amplifier circuit 210, and it can switch a connection between the input terminals In+ and In− and two input terminals of the differential amplifier circuit 210. The second switch 260 is disposed between the output terminals of the differential amplifier circuit 210 and the feedback resistors Rf1 and Rf2, and it can switch a connection between the two output terminals (in other words, output terminals Out+ and Out−) of the differential amplifier circuit 210 and the feedback resistors Rf1 and Rf2. Incidentally, the first switch 250 constitutes one example of the first switching device of the present invention, and the second switch 260 constitutes one example of the second switching device of the present invention. In addition, the first switch 250 and the second switch 260 constitute one example of the modulating device of the present invention.

The defined period generator 270 is provided, for example, with a digital oscillator, a divider, a delay element, a logic circuit, and the like (each of which is not illustrated), and it generates controls signals SWP1, SWP2, and SWP3 for controlling conduction and non-conduction, i.e. switch action, of the first switch 250 and the second switch 260 in accordance with a predetermined period T. The control signal SWP3 is a signal delayed by a time Td, in comparison with the control signals SWP1 and SWP2. The control signal SWP1 is supplied to the first switch 250. The control signal SWP2 is supplied to the second switch 260. The control signal SWP3 is supplied to a third switch 330 described later.

The polarity of an electrical connection between the two terminals of the light receiving element 10 and the two input terminals of the differential amplifier circuit 210 is reversed by the first switch 250. For example, if the control signal SWP1 is at High level, the P terminal of the light receiving element 10 is connected to the plus input terminal of the differential amplifier circuit 210 via the first switch 250. At the same time, if the control signal SWP1 is at High level, the control signal SWP2 is also at High level. The feedback resistor Rf1 is connected to the minus output terminal of the differential amplifier circuit 210 via the second switch 260, and an output voltage from the minus output terminal of the differential amplifier circuit 210 to the P terminal of the light receiving element 10 is subjected to the negative feedback.

In substantially the same manner, if the control signal SWP1 is at Low level, the P terminal of the light receiving element 10 is connected to the minus input terminal of the differential amplifier circuit 210 via the first switch 250. At the same time, if the control signal SWP1 is at Low level, the control signal SWP2 is also at Low level. The feedback resistor Rf1 is connected to the plus output terminal of the differential amplifier circuit 210 via the second switch 260, and an output voltage from the plus output terminal of the differential amplifier circuit 210 to the P terminal of the light receiving element 10 is subjected to the negative feedback.

Complementarily to the negative feedback focusing on the P terminal of the light receiving element 10 described above, the N terminal of the light receiving element 10 is focused. In other words, if the control signal SWP1 is at High level, the N terminal of the light receiving element 10 is connected to the minus input terminal of the differential amplifier circuit 210 via the first switch 250. At the same time, if the control signal SWP1 is at High level, the control signal SWP2 is also at High level. The feedback resistor Rf2 is connected to the plus output terminal of the differential amplifier circuit 210 via the second switch 260, and an output voltage from the plus output terminal of the differential amplifier circuit 210 to the N terminal of the light receiving element 10 is subjected to the negative feedback.

In substantially the same manner, if the control signal SWP1 is at Low level, the N terminal of the light receiving element 10 is connected to the plus input terminal of the differential amplifier circuit 210 via the first switch 250. At the same time, if the control signal SWP1 is at Low level, the control signal SWP2 is also at Low level. The feedback resistor Rf2 is connected to the minus output terminal of the differential amplifier circuit 210 via the second switch 260, and an output voltage from the minus output terminal of the differential amplifier circuit 210 to the N terminal of the light receiving element 10 is subjected to the negative feedback.

By the switch operation of the first switch 250 and the second switch 260, the detection current Idt detected by the light receiving element 10 is current/voltage-converted to the detection voltages VOut+ and VOut−, which are outputted from the output terminals Out+ and Out− of the current/voltage converter 100b, respectively, and each of which has a waveform of a pulse shape according to the defined period T, as shown in FIG. 9. The upper and lower envelopes of the waveforms of the detection voltages VOut+ and VOut− are the waveform according to the detection current Idt and substantially equivalent to a waveform obtained by performing amplitude modulation at a carrier frequency of "1/T". The switch action by the first switch 250 and the second switch 260 is substantially equivalent to the action of a modulator in an Amplitude Modulation (AM) method for amplitude modulation using a defined frequency "1/T".

<Detailed Structure: Amplifier>

Figure 8:
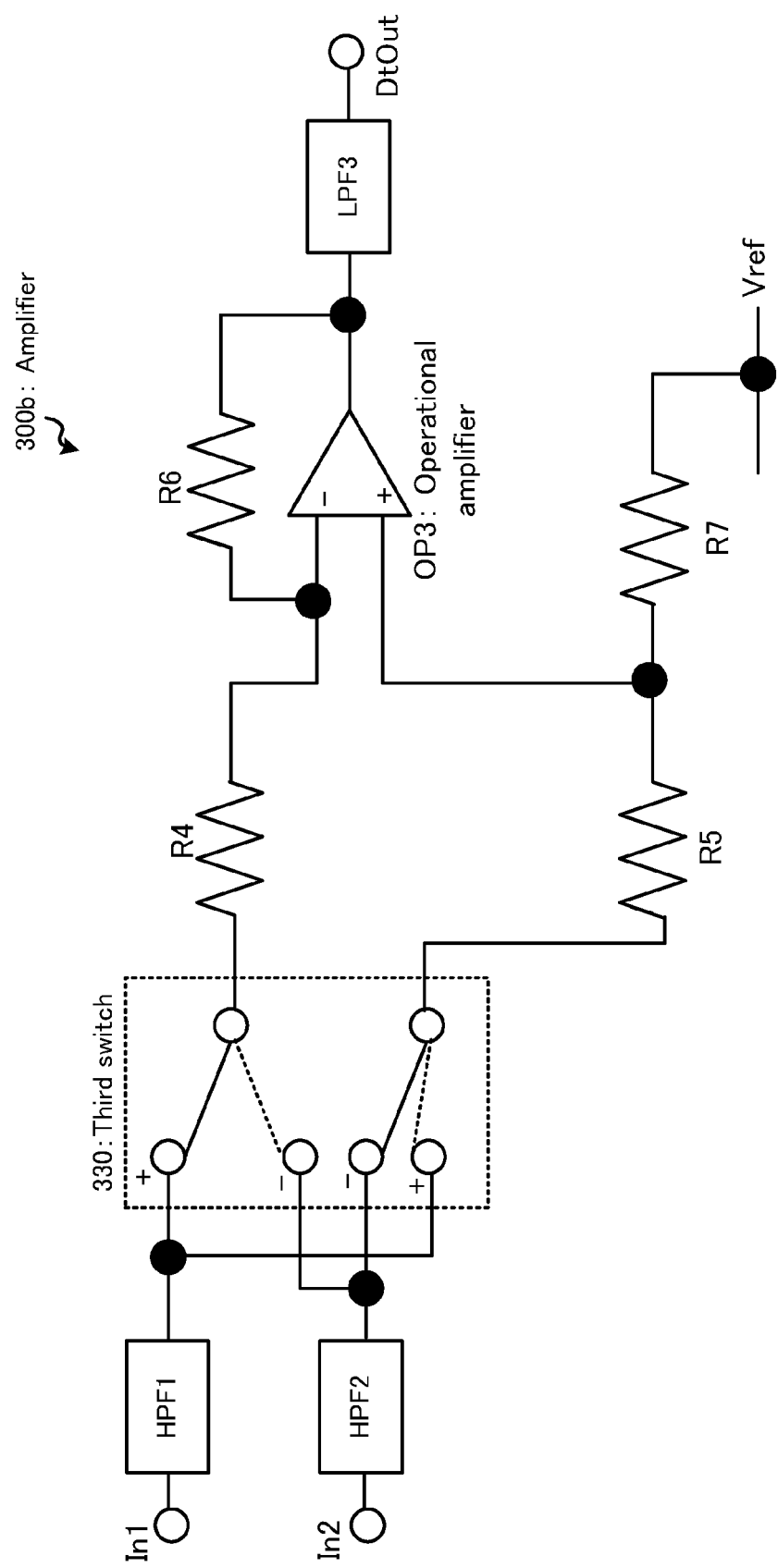
FIG. 8 is a circuit diagram schematically showing the detailed structure of an amplifier 300b in the third embodiment.

Next, with reference to FIG. 7 described above, as occasion demands, in addition to FIG. 8, the detailed structure of an amplifier 300b in the third embodiment and demodulation on the amplifier 300b will be explained. FIG. 8 is a circuit diagram schematically showing the detailed structure of the amplifier 300b in the third embodiment.

As shown in FIG. 8, the amplifier 300b in the third embodiment is provided with high pass filters (i.e. high-frequency pass filters) HPF1 and HPF2, a third switch 330, input resistors R4, R5, and R7, an amplifier OP3, a feedback resistor R6, a low pass filter (i.e. low-frequency pass filter) LPF3.

Between the input terminals In1 and In2 of the amplifier 300b and the amplifier OP3 which is an output stage, there are provided the high pass filters HPF1 and HPF2 and the third switch 330.

The input terminals In1 and In2 of the amplifier 300b are connected to the high pass filters HPF1 and HPF2, respectively.

Incidentally, the third switch 330 constitutes one example of the third switching device and the demodulating device of the present invention. The high-frequency pass circuits HPF1 and HPF2 constitute one example of the high-frequency pass filtering device of the present invention.

Moreover, the amplifier OP3 which is the output stage is accompanied by a low-frequency pass circuit, i.e. the low pass filter LPF3. The low pass filter LPF3 constitutes the low-frequency pass filtering device. Although the example in which the low pass filter LPF3 is located after the amplifier OP3 is shown, the amplifier OP3 may have the LPF characteristics.

By the filtering action of the high-frequency pass circuit, i.e. the high pass filters HPF1 and HPF2, it is possible to appropriately remove a low-frequency noise component generated in the current/voltage conversion from the output signals of the detection voltages VOut− and VOut+ outputted from the output terminals Out− and Out+ of the current/voltage converter 100b shown in FIG. 7 described above. The third switch 330 selectively polarity-reverses the output signals of the detection voltages VOut− and VOut+ outputted from the output terminals Out− and Out+, in accordance with the control signal SWP3 according to the defined period T.

The third switch 330 is substantially equivalent to the action of a demodulator in the amplitude modulation (AM) method for demodulating the modulation signals of the detection voltages VOut− and VOut+ which are modulated by using the defined frequency of "1/T".

The amplifier OP3 differentially amplifies demodulated two current/voltage-converted signals. In particular, the low pass filter LPF3 connected to the amplifier OP3 can effectively suppress a noise component around the carrier frequency which cannot be removed in the demodulation described above and a high-frequency noise component, such as a thermal noise, generated by the feedback resistors Rf1 and Rf2 used for the current/voltage conversion <Examination on Action and Effect in Third Embodiment>

Figure 10:
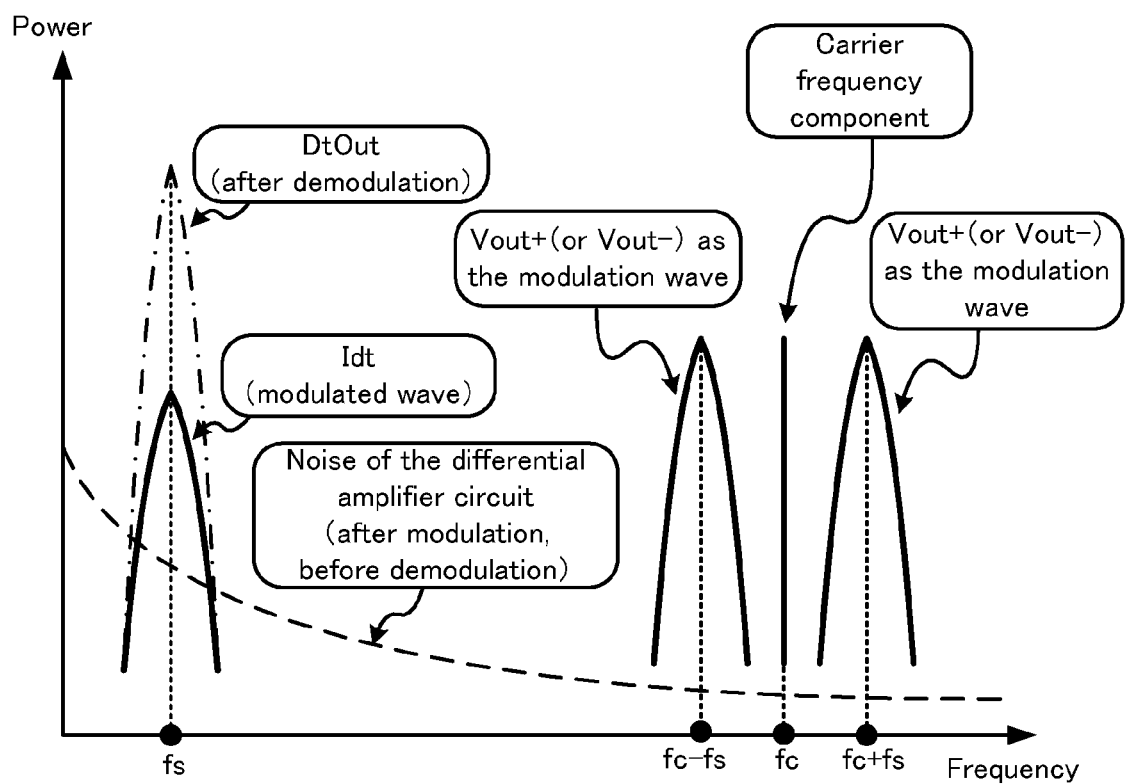
FIG. 10 is a graph schematically showing power spectrums of a modulated wave, a modulation wave, and a demodulation wave in spectrum analysis in the third embodiment.

Now, with reference to FIG. 3 and FIG. 7 described above, as occasion demands, in addition to FIG. 10, the operation and effect of the light amount detecting apparatus in the third embodiment will be examined. FIG. 10 is a graph schematically showing power spectrums of a modulated wave, a modulation wave, and a demodulation wave in spectrum analysis in the third embodiment. Incidentally, a frequency fc in FIG. 10 shows the carrier frequency of a carrier wave in the amplitude modulation, a frequency fc−fs shows the lower side wave of the amplitude modulation, and a frequency fc+fs shows the upper side wave of the amplitude modulation.

If the modulation and the demodulation in the amplitude modulation method in the third embodiment are not performed, as shown in FIG. 10, the detection current Idt detected by the light receiving element 10 has, for example, the spectrum of a signal centered on a frequency fs, and on this spectrum, the current/voltage conversion is performed without change. In this case, as shown in the alternate long and short dash line in FIG. 10, the differential amplifier circuit 210 which constitutes the current/voltage converter 100 generates the low-frequency noise referred to as the so-called "1/f noise". The low-frequency noise has such a tendency that the amplitude of the noise increases with a reduction in frequency, as shown in the alternate long and short dash line in FIG. 10. Thus, this "1/f noise" is added to the signal component of the frequency fs and then current/voltage-converted in the current/voltage conversion. If the modulation and the demodulation in the amplitude modulation in the third embodiment are not performed, the S/N ratio is likely significantly reduced, which is technically problematic.

In contrast to this, in the third embodiment, firstly, the detection voltages Vout− and VOut+ of the current/voltage converter 100b (refer to FIG. 7) are substantially equivalent to the waveform obtained by performing the amplitude modulation at the carrier frequency fc(=1/T) by the switch action of the first switch 250 and the second switch 260. By this, the detection current Idt detected by the light receiving element 10 is current/voltage-converted while being modulated to an amplitude modulation wave having frequency spectrums of upper and lower frequencies, i.e. a "frequency fc+fs" and a "frequency fc−fs", centered on the carrier frequency fc, as shown in FIG. 10. In particular, as shown in FIG. 10, the current/voltage conversion is performed during frequency conversion to the spectrum centered on the frequency fc which is higher than the frequency fs of the detection current Idt described above. Thus, an influence of the aforementioned "1/f noise", i.e. the low-frequency noise (refer to the alternate long and short dash line in FIG. 10), can be almost or completely eliminated.

In other words, the low-frequency noise shown in the alternate long and short dash line in FIG. 10 is mainly the "1/f noise" of the differential amplifier circuit 210 and has a tendency of decreasing with an increase in frequency. Then, by setting the modulation frequency fc to a higher frequency at which the influence of the "1/f noise" is remarkably less by the switch action of the first switch 250 and the second switch 260, it is possible to almost or completely eliminate the influence of the low-frequency noise in performing the current/voltage conversion.

As a result, according to the third embodiment, while almost or completely eliminating the influence of the "1/f noise" of the differential amplifier circuit 210 which constitutes the current/voltage converter 100b, the S/N ratio of the light detection signal DtOut can be improved. Consequently, since the light amount detecting apparatus in the third embodiment is remarkably excellent in the light detection characteristics (or light detection performance) in a low-frequency area, it can detect a small amount of light from a photo sensor for measuring a signal including a low-frequency component such as, for example, a blood flow signal, as biological information.

In particular, as described above, the voltages VOut+ and VOut− are current/voltage-converted while being amplitude-modulated at the carrier frequency fc, which is higher than the frequency fs of the detection current Idt described above, by the switch action of the first switch 250 and the second switch 260 shown in FIG. 7. In addition, the voltages VOut+ and VOut−, which are current/voltage-converted while being amplitude-modulated, are demodulated by the switch action of the third switch 330 after the low-frequency noise described above is removed by the filtering action of the high pass filters HPF1 and HPF2 shown in FIG. 8. As described above, since the voltages VOut+ and VOut− are amplified while being demodulated by the third switch 330 after the low-frequency noise, such as the "1/f noise" described above, which exists after the modulation and before the demodulation in the amplitude modulation method, is removed by the high pass filters HPF1 and HPF2, the S/N ratio can be improved. Thus, it is extremely preferable in practice.

Moreover, since the high-frequency noise, such as the carrier frequency fc component which cannot be removed in the demodulation, can be removed by the low pass filter LPF3 connected to the amplifier OP3 of the amplifier 300b, the S/N ratio can be improved. Thus, it is extremely preferable in practice.

Furthermore, as shown in FIG. 9, the control signal SWP3 for demodulation is a signal delayed by the predetermined time Td, in comparison with the control signals SWP1 and SWP2 for modulation. By this, it is possible to effectively prevent the residual of the harmonic component of the carrier frequency fc in the demodulation, which is caused by a time difference between modulation timing by the current/voltage converter 100b (refer to FIG. 7) and demodulation timing by the amplifier 300b (refer to FIG. 8). By the delay action for delaying the control signal SWP3 by the predetermined time Td, it is possible to effectively suppress the high-frequency noise generated in the demodulation, and it is possible to realize a further improvement in the S/N ratio of the light detection signal.

<Fourth Embodiment>

Figure 11:
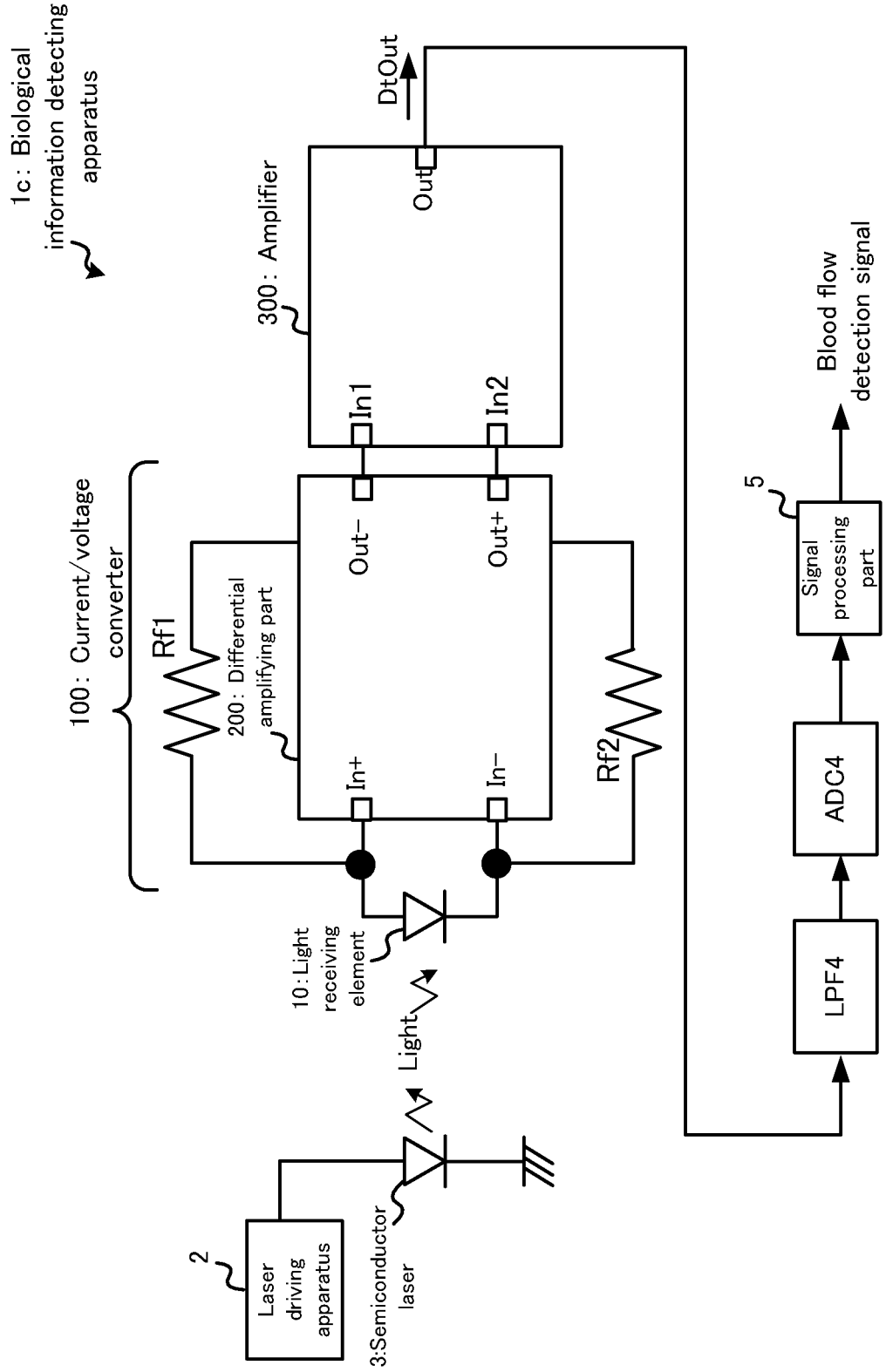
FIG. 11 is a block diagram conceptually showing the entire structure of a blood flow sensor which is one specific example of a biological information detecting apparatus in a fourth embodiment.

Next, with reference to FIG. 11, an explanation will be given on a biological information detecting apparatus which is one specific example of the light amount information processing apparatus in the fourth embodiment. FIG. 11 is a block diagram conceptually showing the entire structure of a blood flow sensor which is one specific example of the biological information detecting apparatus in the fourth embodiment. Incidentally, regarding the constituents in the fourth embodiment, the constituents which are substantially the same as those in the first to third embodiments described above will carry the same reference numerals, and the explanation thereof will be omitted as occasion demands.

As shown in FIG. 11, a biological information detecting apparatus 1c in the fourth embodiment is provided with a laser driving apparatus 2, a semiconductor laser 3, a light receiving element 10, a current/voltage converter 100, an amplifier 300, a low pass filter LPF4, an AD converter ADC4, and a signal processing part 5.

As shown in FIG. 11, the semiconductor laser 3 which is a light source is driven by the laser driving apparatus 2, and light is applied to a specimen. Light scattered by hemoglobin in blood capillaries of the specimen enters the light receiving element 10. A detection current detected by the light receiving element 10 is converted to a voltage by the negative feedback action of feedback resistors Rf1 and Rf2 in the current/voltage converter 100. Then, after differential amplification by the amplification action of the amplifier 300, an amplified light detection signal DtOut is inputted to the low pass filter LPF4. The low pass filter LPF4 removes an aliasing noise by the sampling of the AD converter ADC4. On an output signal from the AD converter ADC4, digital signal processing is performed by the signal processing part 5 such as, for example, a Digital Signal Processor (DSP). A digital signal indicating a blood flow is operated and is outputted as a blood flow detection signal. The blood flow detection signal is inputted to a control device (not illustrated) such as a CPU, via a communication interface such as a wired interface and a wireless interface, and it is displayed by a displaying device (not illustrated) such as a monitor.

Incidentally, in the fourth embodiment, the current/voltage converter in the third embodiment can be applied, instead of the current/voltage converter in the first embodiment. Moreover, in the fourth embodiment, the amplifier in the second embodiment can be applied, instead of the amplifier in the first embodiment. Moreover, in the fourth embodiment, the current/voltage converter and the amplifier in the third embodiment can be applied, instead of the current/voltage converter and the amplifier in the first embodiment.

The present invention is not limited to the aforementioned embodiments, but various changes may be made, if desired, without departing from the essence or spirit of the invention which can be read from the claims and the entire specification. A light amount detecting apparatus and a light amount information processing apparatus, which involve such changes, are also intended to be within the technical scope of the present invention.

Industrial Applicability

The present invention can be applied to, for example, a light amount detecting apparatus, such as a photoelectric converting apparatus for converting a small amount of light to an electrical signal and a measuring instrument for measuring the blood flow of a specimen, and a light amount information processing apparatus for estimating the biological information of the specimen from the measurement result of the blood flow of the specimen.

Description of Reference Codes 1 light amount detecting apparatus
1c biological information detecting apparatus
2 laser driving apparatus
3 semiconductor laser
5 signal processing part
10 light receiving element
100, 100b current/voltage converter
300, 300a, 300b amplifier
200, 200b differential amplifying part
250 first switch
210 differential amplifier circuit
220 midpoint potential detector
230 common negative feedback part
260 second switch
270 defined period generator
330 third switch
Rf1, Rf2 feedback resistor
In1, In2 input terminal
Out output terminal
OP1, OP2, OP3 amplifier
R2, R3, R6 feedback resistor
R1 common input resistor
R4, R5, R7 input resistance
Rc1, Rc2 load resistor
LPF1, LPF2, LPF3, LPF4 low pass filter
ADC1, ADC2, ADC4 AD converter
In+, In− input terminal
Out+, Out− output terminal
HPF1, HPF2 high pass filter

The invention claimed is:

1. A light amount detecting apparatus comprising:
a photoelectric converting element for converting amount of light inputted to a current;
a current/voltage converting device having a positive input terminal connected to a first terminal of said photoelectric converting element, a negative input terminal connected to a second terminal of said photoelectric converting element, a negative output terminal for reversing polarity of a current inputted to the positive input terminal and outputting it as a voltage, a positive output terminal for reversing polarity of a current inputted to the negative input terminal and outputting it as a voltage, a first negative feedback resistor connected between the positive input terminal and the negative output terminal, and a second negative feedback resistor connected between the negative input terminal and the positive output terminal, said current/voltage converting device setting said photoelectric converting element in zero bias and converting the converted current to the voltage;
an amplifying device for amplifying the converted voltage;
a modulating device for modulating a voltage signal of the converted voltage by reversing polarity of the converted voltage with an odd-numbered period defined by a predetermined frequency which is higher than a frequency of the converted current and by not reversing the polarity of the converted voltage with an odd-numbered period defined by the predetermined frequency; and
a demodulating device for demodulating the voltage signal of the converted voltage by reversing the polarity of the converted voltage with the even-numbered period and by not reversing the polarity of the converted voltage with the even-numbered period,
said light amount detecting apparatus further comprising, as said modulating device: a first switching device for changing between a first connection state and a second connection state at the predetermined frequency, wherein in the first connection state, the first terminal and the positive input terminal are connected and the second terminal and the negative input terminal are connected, and in the second connection state, the first terminal and the negative input terminal are connected and the second terminal and the positive input terminal are connected.

2. The light amount detecting apparatus according to claim 1, wherein said current/voltage converting device has a common negative feedback device for performing negative feedback on a potential difference between a reference potential and a midpoint potential of the negative output terminal and the positive output terminal.

3. The light amount detecting apparatus according to claim 2, wherein the common negative feedback device equalizes a potential of the first terminal with a potential of the second terminal of said photoelectric converting element.

4. The light amount detecting apparatus according to claim 1, wherein said amplifying device differentially amplifies the voltage outputted by each of the negative output terminal and the positive output terminal.

5. The light amount detecting apparatus according to claim 1, further comprising, as said modulating device: a second switching device for changing between a third connection state and a fourth connection state at the predetermined frequency, wherein in the third connection state, the negative output terminal and the first negative feedback resistor are connected and the positive output terminal and the second negative feedback resistor are connected, and in the fourth connection state, the negative output terminal and the second negative feedback resistor are connected and the positive output terminal and the first negative feedback resistor are connected.

6. The light amount detecting apparatus according to claim 1 wherein
said amplifying device includes a subtraction amplifying device for differentially amplifying a negative detection voltage outputted by the negative output terminal and a positive detection voltage outputted by the positive output terminal, and
said light amount detecting apparatus further comprises a third switching device for reversing polarities of the negative detection voltage and the positive detection voltage at the predetermined frequency, as said demodulating device.

7. The light amount detecting apparatus according to claim 1, wherein said amplifying device includes a delaying device for delaying timing of demodulating the voltage signal of the converted voltage by a predetermined time.

8. The light amount detecting apparatus according to claim 1, further comprising a high-frequency pass filtering device for removing a low-frequency noise of the voltage signal of the voltage modulated.

9. The light amount detecting apparatus according to claim 1, further comprising a low-frequency pass filtering device for removing a high-frequency noise of the voltage signal of the voltage demodulated.

10. A light amount information processing apparatus comprising:
   said light amount detecting apparatus according to claim 1; and
   a signal processing device for processing a light detection signal which is a voltage signal of the amplified voltage.

* * * * *